US012743569B1

(12) United States Patent
Stefanou et al.

(10) Patent No.: US 12,743,569 B1
(45) Date of Patent: Sep. 22, 2026

(54) ELECTROMAGNETIC MODELING OF SUPERCONDUCTIVE CIRCUITS

(71) Applicant: ANSYS, INC., Canonsburg, PA (US)

(72) Inventors: Stefanos Stefanou, Likovrisi (GR); Ioannis Moysiadis, Nea Chalkidona (GR); Vyron Moutafis, Athens (GR); Konstantis Daloukas, Athens (GR); Konstantinos Nikellis, Agia Paraskevi (GR)

(73) Assignee: ANSYS, INC., Canonsburg, PA (US)

( * ) Notice: Subject to any disclaimer, the term of this patent is extended or adjusted under 35 U.S.C. 154(b) by 1128 days.

(21) Appl. No.: 17/807,559

(22) Filed: Jun. 17, 2022

Related U.S. Application Data

(60) Provisional application No. 63/313,103, filed on Feb. 23, 2022.

(51) Int. Cl.
*G06F 30/367* (2020.01)
*G06F 30/392* (2020.01)

(52) U.S. Cl.
CPC .......... *G06F 30/367* (2020.01); *G06F 30/392* (2020.01)

(58) Field of Classification Search
CPC ............................. G06F 30/367; G06F 30/392
See application file for complete search history.

(56) References Cited

U.S. PATENT DOCUMENTS

2007/0225925 A1* 9/2007 Suaya ..................... G06F 30/30 702/57
2023/0210022 A1* 6/2023 Herr ......................... H10D 1/20 257/31

OTHER PUBLICATIONS

STA (Superconducting Tecnology Assessment), NPL, "National Security Agency Office of Corporate Assessments", Aug. 2005 (Year: 2005).*
C. Phillip McClay, NPL, "Superconducting Microwave Transmission Lines", Oct. 1991 (Year: 1991).*

* cited by examiner

*Primary Examiner* — Rehana Perveen
*Assistant Examiner* — Angel Calle
(74) *Attorney, Agent, or Firm* — WOMBLE BOND DICKINSON (US) LLP

(57) ABSTRACT

Systems and methods for modeling superconductive circuits are described and can use one or more modified partial element equivalent circuit (PEEC) models of the superconductive circuit. The modified PEEC model can include, for each mesh cell in a mesh of the superconductive circuit, a calculated kinetic inductance value and a calculated superconductive resistance value. A meshing method which produces the mesh can use a calculated London penetration depth to determine a minimum mesh cell size to reflect the impact of the superconductive circuit on the meshing method. A modified numerical reduction process also accounts for the effects of superconductivity to reduce errors in linear computations.

20 Claims, 8 Drawing Sheets

CLASSIC PEEC CIRCUIT MODEL

MODIFIED PEEC CIRCUIT MODEL

$$\begin{bmatrix} G & Al^T \\ -Al & 0 \end{bmatrix} + \begin{bmatrix} sC & 0 \\ 0 & sL \end{bmatrix}$$

COMPUTE THE ARNOLDI VECTORS, USING A BLOCK RATIONAL ARNOLDI METHOD

USE THE ARNOLDI VECTORS TO PROJECT THE MNA MATRICES ONTO THE REDUCED SUBSPACE USING BLOCK-BASED PROJECTION $$\begin{bmatrix} V_1^T & 0 \\ 0 & V_2^T \end{bmatrix} * \left( \begin{bmatrix} G & Al^T \\ -Al & 0 \end{bmatrix} + \begin{bmatrix} C & 0 \\ 0 & L \end{bmatrix} \right) * \begin{bmatrix} V_1 & 0 \\ 0 & V_2 \end{bmatrix}$$

CONSTRUCT THE REDUCED MNA REPRESENTATION OF THE CIRCUIT $$\begin{bmatrix} V_1^T * G * V_1 & V_1^T * Al^T * V_2 \\ -V_2^T * Al * V_1 & 0 \end{bmatrix} + \begin{bmatrix} sV_1^T * C * V_1 & 0 \\ 0 & sV_2^T * L * V_2 \end{bmatrix}$$

CONSTRUCT THE FINAL REDUCED MODEL

FIG. 5A
(PRIOR ART)

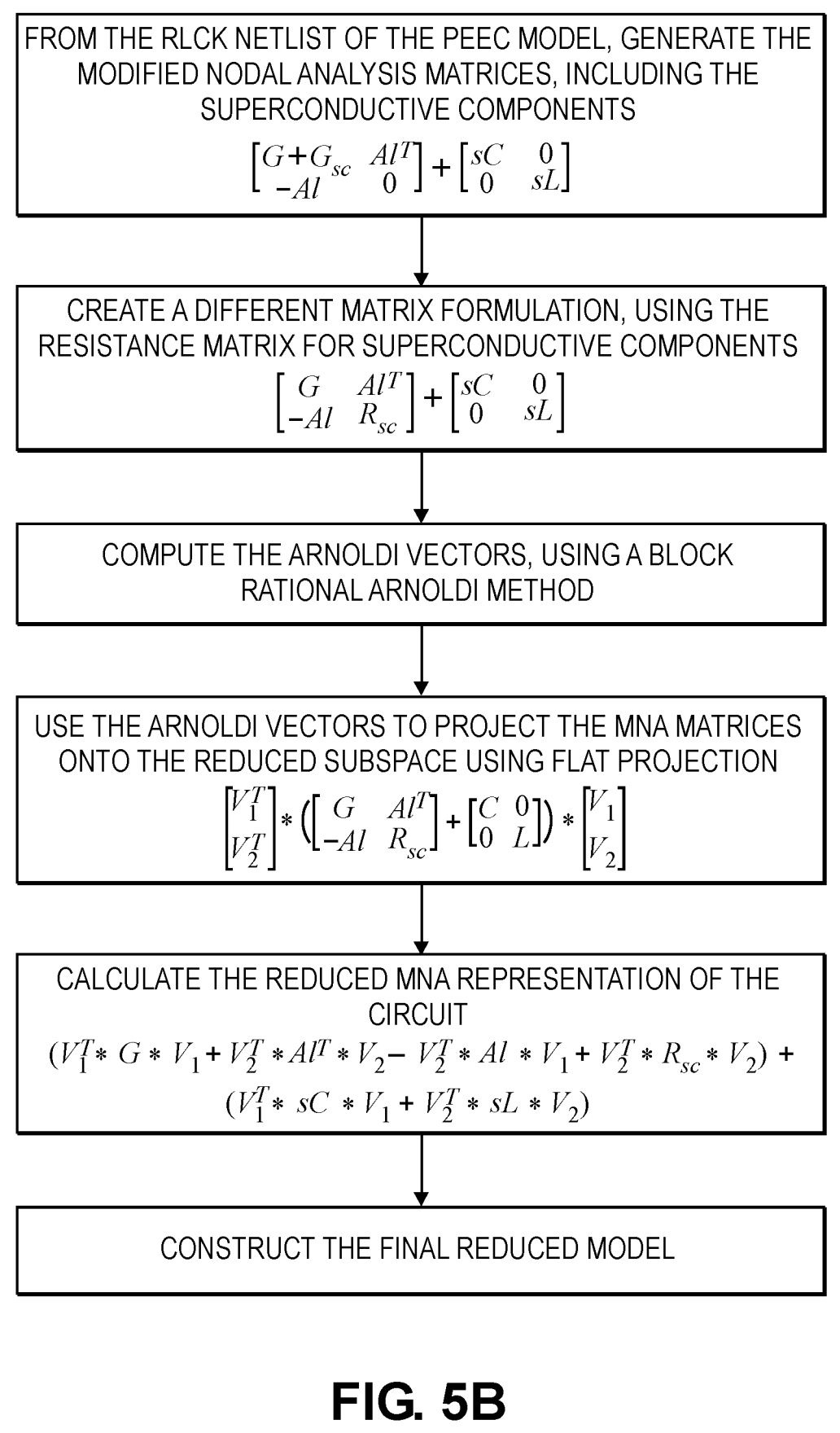

FROM THE RLCK NETLIST OF THE PEEC MODEL, GENERATE THE MODIFIED NODAL ANALYSIS MATRICES, INCLUDING THE SUPERCONDUCTIVE COMPONENTS $$\begin{bmatrix} G+G_{sc} & Al^T \\ -Al & 0 \end{bmatrix} + \begin{bmatrix} sC & 0 \\ 0 & sL \end{bmatrix}$$

↓

CREATE A DIFFERENT MATRIX FORMULATION, USING THE RESISTANCE MATRIX FOR SUPERCONDUCTIVE COMPONENTS $$\begin{bmatrix} G & Al^T \\ -Al & R_{sc} \end{bmatrix} + \begin{bmatrix} sC & 0 \\ 0 & sL \end{bmatrix}$$

↓

COMPUTE THE ARNOLDI VECTORS, USING A BLOCK RATIONAL ARNOLDI METHOD

↓

USE THE ARNOLDI VECTORS TO PROJECT THE MNA MATRICES ONTO THE REDUCED SUBSPACE USING FLAT PROJECTION $$\begin{bmatrix} V_1^T \\ V_2^T \end{bmatrix} * \left( \begin{bmatrix} G & Al^T \\ -Al & R_{sc} \end{bmatrix} + \begin{bmatrix} C & 0 \\ 0 & L \end{bmatrix} \right) * \begin{bmatrix} V_1 \\ V_2 \end{bmatrix}$$

↓

CALCULATE THE REDUCED MNA REPRESENTATION OF THE CIRCUIT $$(V_1^T * G * V_1 + V_2^T * Al^T * V_2 - V_2^T * Al * V_1 + V_2^T * R_{sc} * V_2) + (V_1^T * sC * V_1 + V_2^T * sL * V_2)$$

↓

CONSTRUCT THE FINAL REDUCED MODEL

FIG. 5B

ELECTROMAGNETIC MODELING OF SUPERCONDUCTIVE CIRCUITS

This application claims the benefit of the filing date of U.S. provisional patent application No. 63/313,103, which was filed on Feb. 23, 2022 by Applicant Ansys, Inc., and this provisional patent application is hereby incorporated herein by reference.

BACKGROUND

This disclosure relates to the field of simulations of physical systems and in particular to the simulation of systems that include a superconductive circuit.

Superconductive circuits have properties that make them useful in certain contexts despite the incredibly low temperatures which are normally required for specific materials to become superconductors. For example, superconductive circuits can be employed in quantum computers which may be useful for certain types of computations because quantum computers may be able to provide results from the computations in a feasible time frame while conventional computers (that use non-superconductive circuits) may take too long to provide results from the computations.

Simulation and modeling of conventional (non-superconductive) circuits provides designers with ways to design and evaluate a circuit (such as a complex integrated circuit containing millions of gates). The simulations and modeling allow a designer to test circuit timing, thermal characteristics of the circuit, power consumption characteristics, electromagnetic characteristics of the circuit, etc.

At this point in time, the simulation and modeling of superconductive circuits is complicated by the nature of such circuits. They have properties that are inconsistent with many existing circuit models, making it impossible to use such existing circuit models. These properties include the Meisner effect (expelling of a magnetic field), the appearance of kinetic inductance, and the electrical field penetration (London penetration depth).

SUMMARY OF THE DESCRIPTION

Systems and methods for modeling superconductive circuits are described and can use one or more modified partial element equivalent circuit (PEEC) models of the superconductive circuit. The modified PEEC model can include, for each mesh cell in a mesh of the superconductive circuit, a calculated kinetic inductance value and a calculated superconductive resistance value. A meshing method which produces the mesh can use a calculated London penetration depth to determine a minimum mesh cell size to reflect the current distribution on the superconductive circuit A modified numerical reduction process also accounts, as described further below, to reduce the size of the PEEC final output model.

A method in one embodiment can include the following operations: receiving a representation of a design of a superconductive circuit; generating a mesh representation of at least portions of the superconductive circuit; determining a set of one or more kinetic inductance values and a set of one or more superconductive resistance values; including or adding the determined set of one or more kinetic inductance values and the determined set of one or more superconductive resistance values into a set of one or more partial element equivalent circuit (PEEC) models of the superconductive circuit; and computing, from the set of one or more PEEC models, a set of one or more inductance values and a set of one or more resistance values. In one embodiment, the method further includes the operation of computing a set of one or more capacitance values and substrate coupling (e.g., using a random walk solver). In one embodiment, the method further includes the operation of generating a netlist model from the set of one or more PEEC models and the set of one or more capacitance values. In one embodiment, the representation of the design comprises layout data about the superconductive circuit and geometry data based on layers of metals and dielectrics in a three dimensional stack of the superconductive circuit.

In one embodiment, the mesh representation comprises a set of mesh cells that collectively extend over the representation of the design of the superconductive circuit, and wherein a minimum mesh cell size, used by a meshing method to generate the mesh representation, is based on a computed London penetration depth. In one embodiment, each mesh cell in the set of mesh cells is associated with one PEEC model from the set of PEEC models and one capacitance value from the set of capacitance values such that the set of kinetic inductance values and superconductive resistance values are computed on a per mesh cell basis. In one embodiment, for each mesh cell, the determined kinetic inductance value for each mesh cell and the determined superconductive resistance value for each mesh cell are connected in series and added into a PEEC model for each mesh cell in parallel across a resistance value (non-superconductive R) in the PEEC model. In one embodiment, the method can further include numerical reduction operations on the netlist model to produce an output model. Prior to the numerical reduction operation, the superconductive resistance values of the netlist are placed into a separate matrix, instead of the normal conductance matrix; this reduces the impact of the disparity between non-superconductive resistance values and superconductive resistance values.

The aspects and embodiments described herein can include non-transitory machine readable media that can store executable computer program instructions that when executed cause one or more data processing systems to perform the methods described herein when the computer program instructions are executed. The instructions can be stored in non-transitory machine readable media such as in dynamic random access memory (DRAM) which is volatile memory or in nonvolatile memory, such as flash memory or other forms of memory. The aspects and embodiments described herein can also be in the form of data processing systems that are built or programmed to perform these methods. For example, a data processing system can be built with hardware logic to perform these methods or can be programmed with a computer program to perform these methods and such a data processing system can be considered a simulation system.

The above summary does not include an exhaustive list of all embodiments and aspects in this disclosure. All systems, media, and methods can be practiced from all suitable combinations of the various aspects and embodiments summarized above and also those disclosed in the detailed description below.

BRIEF DESCRIPTION OF THE DRAWINGS

The present invention is illustrated by way of example and not limitation in the figures of the accompanying drawings in which like references indicate similar elements.

FIG. 5A shows an example in the prior art that uses a numerical reduction method and FIG. 5B shows an embodiment which employs a numerical reduction method to a circuit model such as an RLCK model which may be represented in a netlist.

DETAILED DESCRIPTION

Various embodiments and aspects will be described with reference to details discussed below, and the accompanying drawings will illustrate the various embodiments. The following description and drawings are illustrative and are not to be construed as limiting. Numerous specific details are described to provide a thorough understanding of various embodiments. However, in certain instances, well-known or conventional details are not described in order to provide a concise discussion of embodiments.

Reference in the specification to "one embodiment" or "an embodiment" means that a particular feature, structure, or characteristic described in conjunction with the embodiment can be included in at least one embodiment. The appearances of the phrase "in one embodiment" in various places in the specification do not necessarily all refer to the same embodiment. The processes depicted in the figures that follow are performed by processing logic that comprises hardware (e.g. circuitry, dedicated logic, etc.), software, or a combination of both. Although the processes are described below in terms of some sequential operations, it should be appreciated that some of the operations described may be performed in a different order. Moreover, some operations may be performed in parallel rather than sequentially.

The embodiments described herein provide methods and systems for modeling systems that include superconductive circuits which are electrical circuits that incorporate superconductive elements such as superconductive passive and active elements in an electrical circuit, and the systems may also include non-superconductive elements. A designer of such a system can have design requirements for the superconductive circuit, and these design requirements can be tested in simulations of the system.

Figure 1:
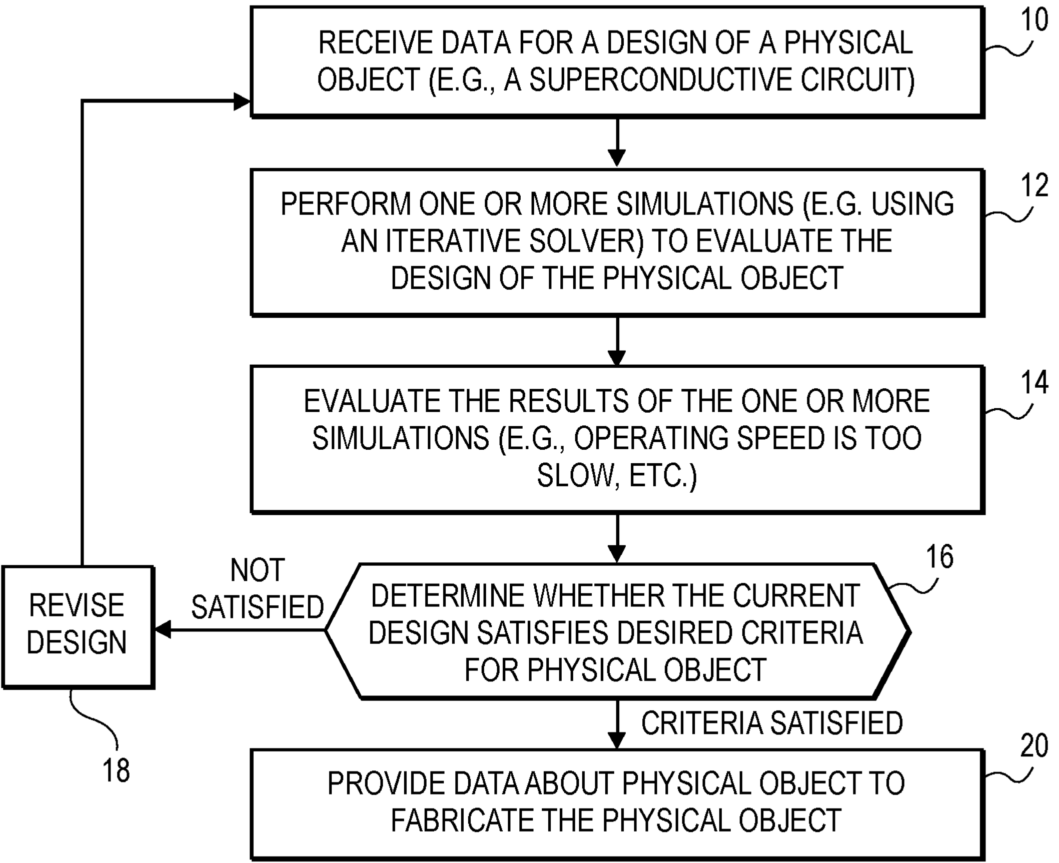
FIG. 1 shows an example of a method in which the disclosed embodiments can be used.

FIG. 1 shows a method in which these design requirements can be tested relative to a particular design of a superconductive circuit which is being simulated for a given system. In operation 10 of FIG. 1, a data processing system (e.g., a computer executing simulation software to provide a simulation system) can receive data about a design for a particular system (e.g., a superconductive circuit in a system that may also include a non-superconductive circuits which may be external to the superconductive circuit, etc.). The design data can be created in CAD (computer aided design) software on a data processing system, and the data can include information about the superconductive circuit, etc. Then in operation 12, the data processing system can perform one or more simulations (such as power consumption simulations or timing simulations based on physical models of the circuit) to evaluate the design of the circuit during the simulated operation of the circuit. These simulations can use the results (e.g., one or more netlists) of the aspects and embodiments described herein. In operation 14, the designer can evaluate the results of one or more simulations to determine whether the design of the circuit satisfies certain desired criteria for the design (e.g., timing parameters are achieved, etc.). This determination is shown in operation 16. If the one or more criteria is satisfied, then the designer in operation 20 can provide data about the circuit to allow the fabrication or manufacture of the circuit. For example, if the one or more criteria are satisfied, a CAD file can be produced that describes how to build the circuit. If the criteria are not satisfied as determined in operation 16, the designer can revise the design in operation 18 (for example, by changing sizes and/or quantity of the superconductors, etc.) and repeat the process by performing additional further simulations to evaluate the redesigned circuit and system. This can be repeated until the desired criteria are achieved for the object.

Figure 2:
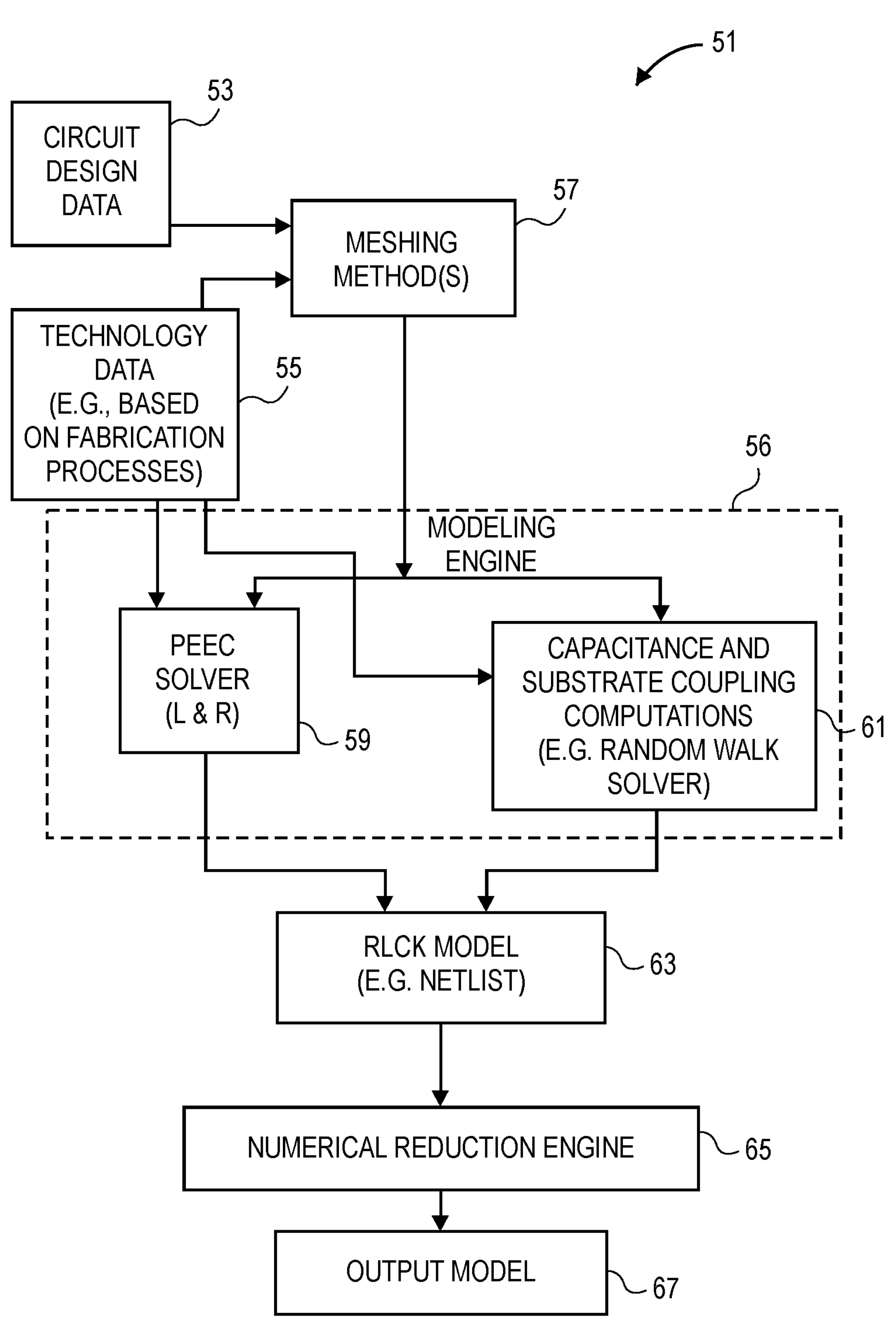
FIG. 2 is a block diagram of an embodiment.

One embodiment of a method is shown in FIG. 2. The method 51 can be performed by a simulation system, such as a data processing system that executes simulation software to perform simulations of a superconductive circuit. The simulation system receives a circuit design data 53 which may be in the form of a conventional circuit design database that describes the circuit which includes a superconductive circuit. The simulation system also receives technology data 55 that describes the fabrication technology and processes that will be used to fabricate the circuit; this technology data can be conventional technology data known in the art and can include data about materials of conductors and dielectrics in the stack of the circuit and their sizes, etc. The simulation system can use this received data to generate a mesh representation of the circuit using one or more meshing methods 57; the meshing methods can be any one of the known meshing methods (e.g., those used in finite element methods), although these meshing methods should be modified, as described below to account for the London penetration depth (by computing the London penetration depth (k) and using that computed value to determine or set a minimum mesh cell size for the meshing methods).

The simulation system can then use a modeling engine 56 to generate a model of the superconductive circuit, and this modeling engine 56 can include a PEEC solver 59 that uses a modified PEEC model (explained further below) to compute inductance and resistance values in a network for each mesh cell and a capacitance solver 61 (e.g., a conventional random walk solver) that computes capacitance values and substrate coupling capacitance values for each mesh cell. Each of the equivalent networks from these solvers are connected based upon the circuit design data 53. The computations produced by these solvers can then produce a model of the resistance (R), inductance (L), capacitance (C) and mutual inductive coupling (k) of the portion of the circuit in each mesh cell which can be assembled into a complete RLCk model 63 that can be represented by a netlist that models the complete superconductive circuit. The RLCk model 63 may then be modified by a numerical reduction engine 65 as described further below to reduce the size of the final output model 67 and make it more efficient for circuit simulations. The numerical reduction engine 65 can produce, after a set of one or more operations on the RLCk model 63, an output model 67 that can be used in one or more circuit simulations of the superconductive circuit. Further information about numerical reduction methods are described below. These one or more simulations, using the output model 67, can be simulations designed to show how the superconductive circuit performs, including (for example) power simulations, timing simulations, electromagnetic characteristics simulations, etc.

Figure 3A:
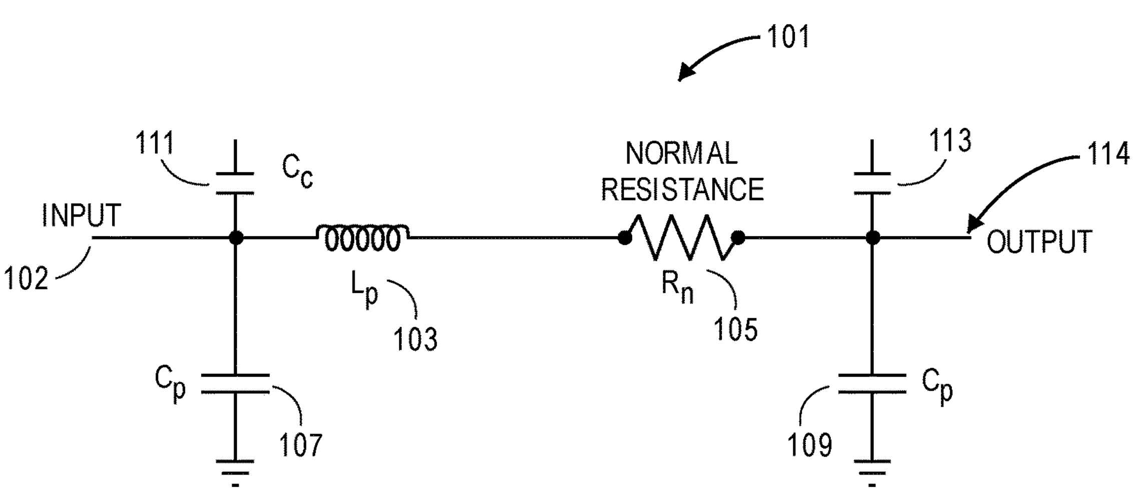
FIG. 3A shows an example of a classic PEEC model.
Figure 3B:
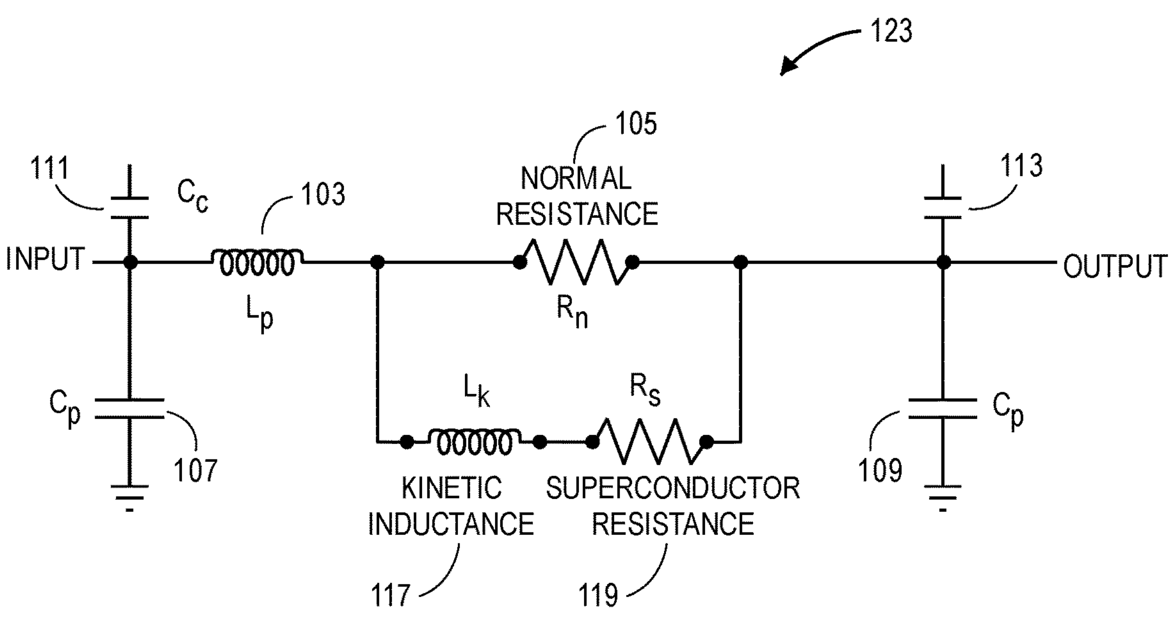
FIG. 3B shows an example of a modified PEEC model according to one embodiment.

The methods described herein can use a modified PEEC circuit model as shown in FIG. 3B. FIG. 3A shows a conventional ("classic") PEEC circuit model 101 used in modeling non-superconductive circuits. This PEEC circuit model 101 includes capacitances 111 ($C_c$), 107 ($C_p$), 113, and 109 ($C_p$) connected as shown in FIG. 3A, to the input 102 and the output 114 of the circuit in FIG. 3A. The PEEC circuit model 101 also includes a conventional inductance 103 ($L_p$) and a non-superconductive resistance 105 ($R_n$) as shown in the PEEC circuit model 101. This circuit model 101 does not properly reflect the properties of superconductive circuits and hence cannot be used to model superconductive circuits. For example, this conventional PEEC circuit model 101 does not account for the two different current flows in a superconductive circuit; in a superconductor, a portion of the electrons flow in a normal, non-superconductive manner while another portion flows with a superconductive behavior (including with much lower resistance). This conventional PEEC model 101 also does not account for a kinetic inductance ($L_k$) that has no mutual coupling component (only a self-inductance component). The kinetic inductance is dependent on the size of the superconductor and the temperature of the superconductor. This conventional PEEC model 101 also does not account for superconductive electrical resistance ($R_S$) which is dependent on the square of frequency and is proportional to the conductivity (in contrast to $R_n$ which is dependent on the square root of the frequency and is inversely proportional to conductivity).

The modified PEEC circuit model 123 in FIG. 3B is used in the embodiments described herein and properly accounts for the superconductive behavior of a superconductive circuit. The modified PEEC model 123 includes the same set of capacitances as in the PEEC circuit model 101 and includes the inductor 103 and the normal (non-superconductive) resistance $R_n$ 105. Unlike the PEEC circuit model 101, the modified PEEC circuit model includes a kinetic inductance 117 ($L_k$) and a superconductor resistance 119 ($R_S$). The kinetic inductance 117 and the superconductor resistance 119 are connected in series as shown in FIG. 3B, and they are connected in parallel across the normal resistance 105 as shown in FIG. 3B. This correctly models the behavior of superconductive circuits by taking into account the different behavior of superconductive circuits. In the embodiments described herein, the kinetic inductance ($L_K$) is computed for each modified PEEC model within each mesh cell (the individual facets in the mesh) and the superconductor resistance ($R_S$) is also computed for each modified PEEC model within each mesh cell. These computations of $L_K$ and $R_S$ use the design data as inputs; in one embodiment, the kinetic inductance can be computed from the formula:

$$L_k = \mu_0 \lambda^2 \frac{l}{A},$$

where λ is the London penetration depth, A is the cross section area of the material (e.g., a metal), l is the length of the segment of the material, and po is the magnetic permeability of free space. In one embodiment, the superconductive electrical resistance can be calculated from the following formula: $R_S \sim \omega^2 \mu^2 \sigma \lambda^3$, where σ is the normal conductivity of the material and ω is the angular velocity which is related to the operating frequency of the circuit: ω=2πf (where f is the operating frequency). The modified PEEC model can be used across the entire band of possible frequencies of interest, providing an equivalent resistance that is dependent on the square of frequency, as it is theoretically anticipated for superconductors. The modified PEEC model, for each mesh cell, can be used by a PEEC solver to return an equivalent inductance and resistance network for all segments in the mesh cell. It has been observed from this modified PEEC model that it accurately reflects the behavior of superconductors at the opposite extremes of the frequency band, so the modified PEEC model can provide accurate solutions over the entire frequency range of interest.

Figure 4A:
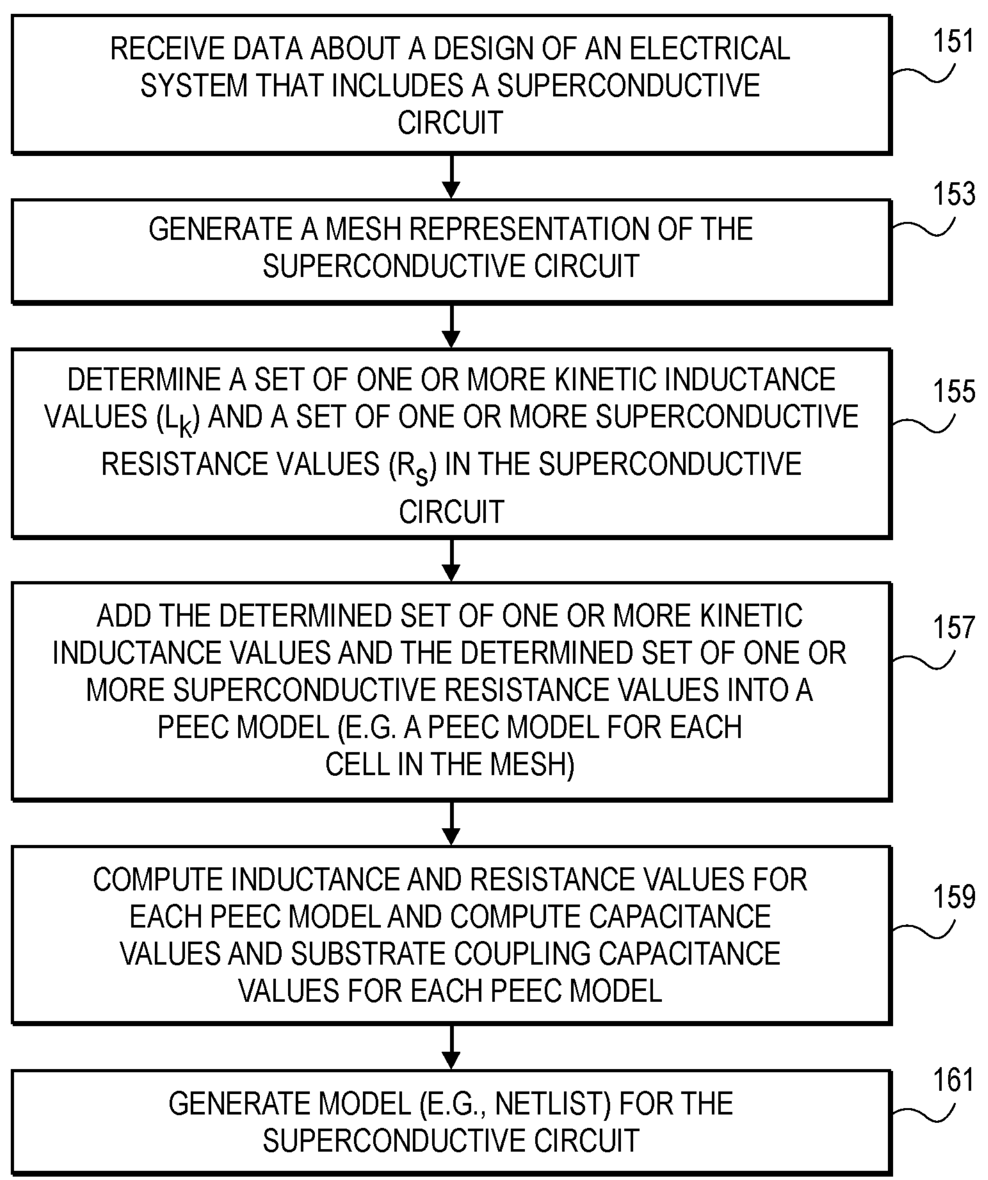
FIG. 4A is a flow chart that shows an example of a method according to one embodiment.

A method according to one embodiment is shown in FIG. 4A. This method can be performed on a simulation system, and this method is similar to the method shown in FIG. 2. In operation 151 in FIG. 4A, a simulation system receives data about a design of an electrical system that includes a superconductive circuit (e.g., the simulation system receives circuit design data 53 and technology data 55 described above). The simulation system can then generate a mesh representation of the superconductive circuit using known meshing methods; this meshing method can determine the minimum mesh cell size based on a computed London penetration depth as described herein. Then the simulation system, in operation 155, computes a set of one or more kinetic inductance ($L_K$) values and a set of one or more superconductive resistance ($R_S$) values in the superconductive circuit. These computed values ($L_K$ and $R_S$) are then added, in operation 157, by the simulation system into a PEEC model for each mesh cell to generate a modified PEEC model for each mesh cell in the mesh representation. Then in operation 159, the simulation system computes inductance and resistance values for each modified PEEC model and also computes capacitance values and substrate coupling capacitance values for each modified PEEC model. These computations produce, in operation 161, an equivalent RLCk model that can be represented in a conventional netlist format which can be used in simulations of the superconductive circuit. These simulations can be conventional circuit simulations that simulate power consumption, timing analyses, electromagnetic characteristics, etc.

Figure 4B:
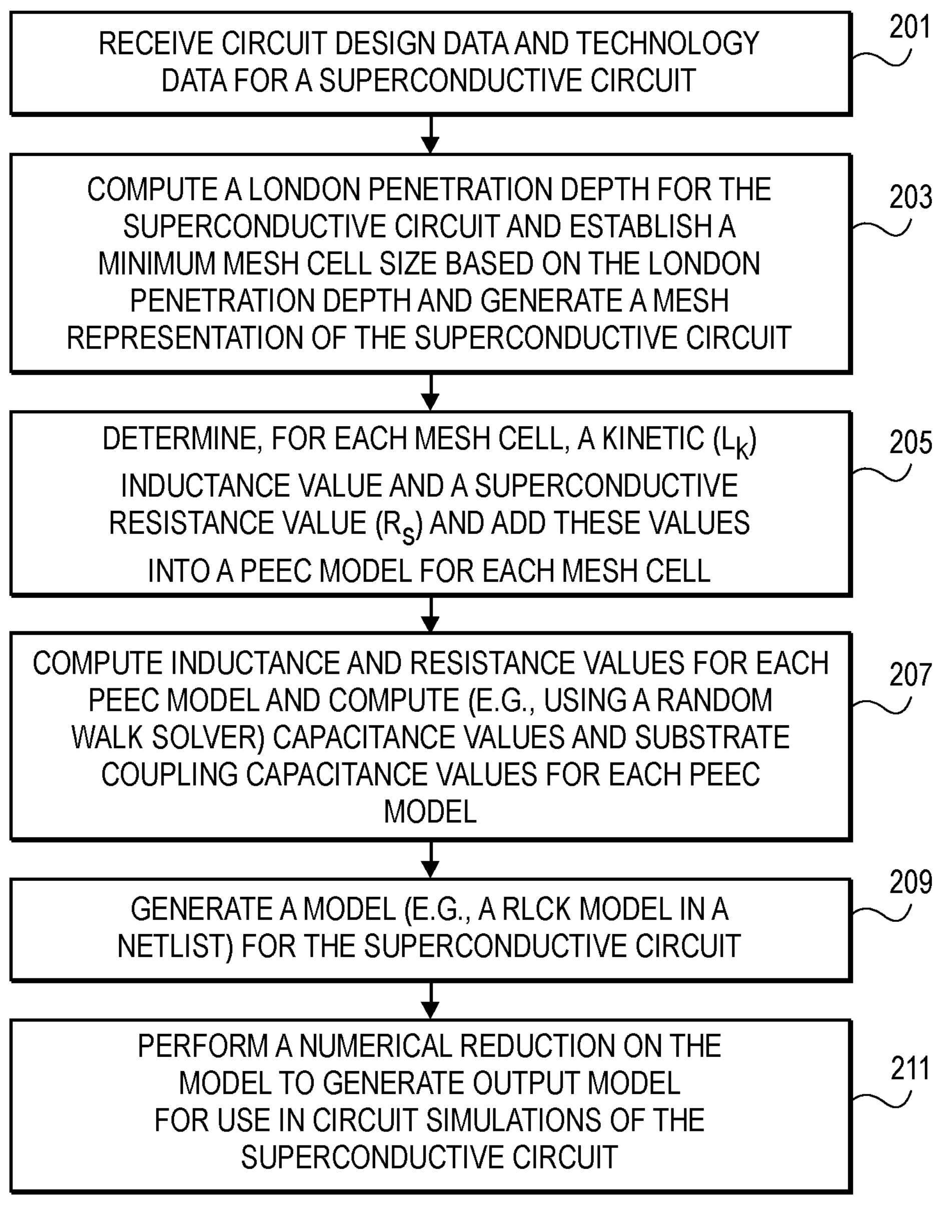
FIG. 4B is a flow chart that shows another example of a method according to one embodiment.

A method according to another embodiment is shown in FIG. 4B. In operation 201, a simulation system receives circuit design data and technology data for a superconductive circuit. Then in operation 203, the simulation system computes a London penetration depth (λ) for the superconductive circuit. The London penetration depth can then be used to set or establish the minimum mesh cell size. In one embodiment, the London penetration depth can be computed using the formula:

$$\lambda_{(T)} = \frac{\lambda_{(0)}}{\sqrt{1 - \left(\frac{T}{T_c}\right)^4}}$$

where $\lambda_0$ is the penetration depth at 0 degrees Kelvin and T is the expected temperature (to be used in the simulation) and $T_c$ is the material's critical temperature. The London penetration depth is frequency independent and temperature dependent and as a result it renders the typical meshing mechanism for conductors (based on skin depth) inapplicable. Since the value of (λ) is usually much smaller than the skin depth (δ), the scaling of the mesh cells towards the center of a superconductor can be more aggressive (larger mesh cell sizes) so as to maintain the efficiency of the engine. In one embodiment, the meshing method can compute λ and use it to establish the minimum mesh cell size or the meshing method can receive a defined London penetration depth from the circuit designer. The simulation system then generates a mesh representation using the minimum mesh cell size established from the London penetration depth.

The simulation system can generate a particular PEEC model including a kinetic inductance and a superconductive resistance according to the computed kinetic inductance and superconductive resistance values. The particular PEEC model, e.g. 123 in FIG. 3B, can correspond to a basic PEEC model, e.g. 101 in FIG. 3A, updated with additional kinetic inductance and superconductive resistance elements.

In operation 205, the simulation system determines, for each mesh cell, a kinetic inductance value ($L_K$) and a superconductive resistance value ($R_S$) and adds these values into a modified PEEC model (configured as shown in FIG. 3B) for each mesh cell which represents a portion of the superconductive circuit. Then in operation 207, the simulation system can compute inductance and resistance values for each modified PEEC model for each mesh cell (e.g., using a PEEC solver to solve the modified PEEC model to return an equivalent inductance and resistance network for all segments in the mesh cell) and also compute (e.g., using a conventional random walk solver) capacitance values and substrate coupling capacitance values for each mesh cell's modified PEEC model. These computations produce a set of equivalent circuits across all of the mesh cells that can be assembled (in operation 209), based on their locations in the mesh, into an equivalent RLCk model that can be represented in a conventional netlist format which can be used in simulations of the superconductive circuit. Although this RLCk netlist model could be used in such simulations, its sheer size makes it intractable for any circuit simulator. Thus, a model order reduction step is desirable. An additional challenge, found especially in the case of superconductive circuits has to do with the disparity in resistance values (e.g., the superconductive resistance values can be very small relative to the normal resistance values), which can impact the condition number of matrices and can introduce errors. in the reduction process. As a result, the embodiment in FIG. 4B uses operation 211 to perform numerical reduction on the equivalent RLCk model to generate a final output model that is used in the simulations of the superconductive circuit. Further information about the use of numerical reduction is provided below in conjunction with FIG. 5B.

An efficient technique for computing the reduced model is the block rational Arnoldi method, based on Krylov subspace. The method is shown in FIG. 5A. The first operation of such a process is to construct the MNA formulation of the circuit from the full PEEC model (X). The MNA representation is has the following form:

$$\begin{bmatrix} G & Al^T \\ -Al & 0 \end{bmatrix} + \begin{bmatrix} sC & 0 \\ 0 & sL \end{bmatrix}, \tag{1}$$

where G is the conductance matrix, C is the capacitance matrix, L is the inductance matrix, Al is the connectivity matrix and s is the frequency. A linear system with the coefficient matrix of Eq. (1) has to be solved in each iteration of the block rational Arnoldi method for computing the corresponding Arnoldi vectors. After the Arnoldi iterative process is terminated, the resulted vectors are used for projecting the MNA matrices onto the reduced subspace. A block-based projection is applied as follows, aiming to preserve the initial structure of the circuit:

$$\begin{bmatrix} V_1^T & 0 \\ 0 & V_2^T \end{bmatrix} * \left( \begin{bmatrix} G & Al^T \\ -Al & 0 \end{bmatrix} + \begin{bmatrix} sC & 0 \\ 0 & sL \end{bmatrix} \right) * \begin{bmatrix} V_1 & 0 \\ 0 & V_2 \end{bmatrix}, \tag{2}$$

where $$V = \begin{bmatrix} V_1 \\ V_2 \end{bmatrix}$$

is the matrix that is comprised of the vectors that are calculated at each iteration of the Arnoldi method [2]. By applying block-matrix operations in Eq. (2), we get the set of reduced matrices as described in Eq. (3):

$$\begin{bmatrix} V_1^T * G * V_1 & V_1^T * Al^T * V_2 \\ -V_2^T * Al * V_1 & 0 \end{bmatrix} + \begin{bmatrix} sV_1^T * C * V_1 & 0 \\ 0 & sV_2^T * L * V_2 \end{bmatrix}, \tag{3}$$

In order to apply this method for superconductive circuits, the additional superconductive components will need to be added in the MNA formulation which can be rewritten as follows:

$$\begin{bmatrix} G + G_{sc} & Al^T \\ -Al & 0 \end{bmatrix} + \begin{bmatrix} sC & 0 \\ 0 & sL \end{bmatrix}, \tag{4}$$

where the matrix $G_{SC}$ is the conductance matrix corresponding to the superconductive resistance branches. The inclusion of superconductive components into the PEEC model, as shown in FIG. 3B, into the MNA formulation poses certain challenges that make the method of FIG. 5A inefficient. In particular, the superconductive resistor branches have resistance values which are orders of magnitude lower than the normal resistance values. For this reason, introduction of the $G_{SC}$ matrix into the linear system significantly impacts the condition number of the coefficient matrix. The increased condition number results in numerical instabilities and large floating-point errors. Hence, solving a linear system with the coefficient matrix of Eq. (4) is not feasible even for state-of-the-art direct solvers such as PARDISO [3] and MUMPS [4].

To overcome this problem, a different matrix formulation, which utilizes the resistance matrix $R_{SC}$ instead of the conductance matrix $G_{SC}$, is proposed in order to overcome the numerical instabilities (see FIG. 5B). The equation of the new formulation is the following:

$$\begin{bmatrix} G & Al^T \\ -Al & R_{sc} \end{bmatrix} + \begin{bmatrix} sC & 0 \\ 0 & sL \end{bmatrix}, \tag{5}$$

where $R_{SC}$ is combined with the inductance matrix L. The resulting coefficient matrix in Eq. (5), has decreased condition number, therefore the corresponding linear system can be solved effectively using a direct method.

Although the above modification improves the quality of results, numerical instabilities can still occur in the computation of the final model. For this reason, an additional modification has to do with the application of a flat projection technique instead of the block-based projection which is show in Eq. (2) to further improve the accuracy of the final model. The proposed projection can be written as follows:

$$[V_1^T V_2^T] * \left( \begin{bmatrix} G & Al^T \\ -Al & R_{sc} \end{bmatrix} + \begin{bmatrix} sC & 0 \\ 0 & sL \end{bmatrix} \right) * \begin{bmatrix} V_1 \\ V_2 \end{bmatrix} \tag{6}$$

By applying the operations in Eq. (6), we derive the final reduced matrix as shown in the following equation:

$$(V_1^T * G * V_1 + V_1^T * Al^T * V_2 - V_2^T * Al * V_1 + V_2^T * R_{sc} * V_2) + (V_1^T * sC * V_1 + V_2^T * sL * V_2$$

$$(V_1^T * G * V_1 + V_1^T * Al^T * V_2 - V_2^T * Al * V_1 + V_2^T * R_{sc} * V_2) + (V_1^T * sC * V_1 + V_2^T * sL * V_2$$

Figure 6:
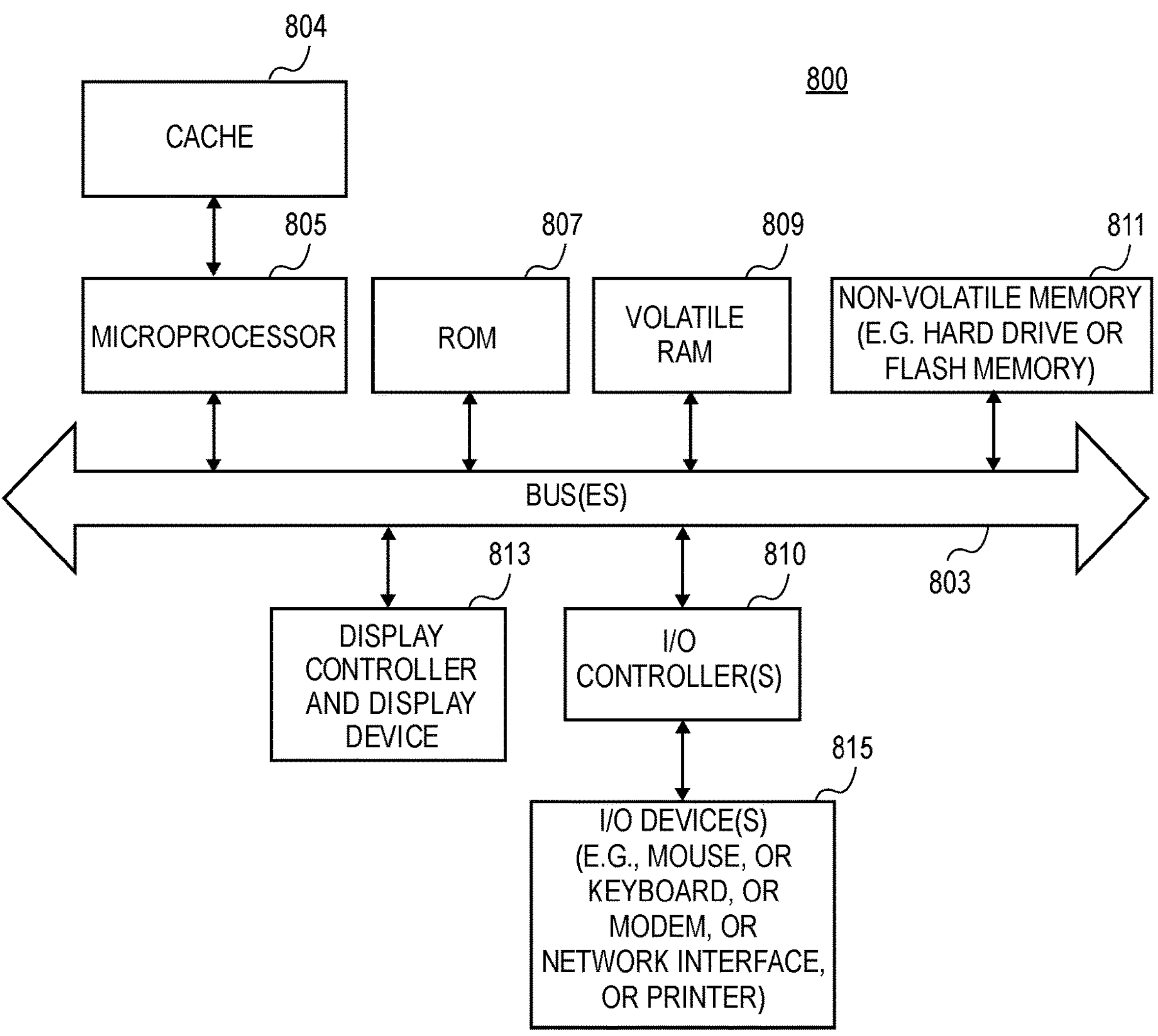
FIG. 6 shows an example of a data processing system which can be a simulation system that is used to perform one or more of the methods described herein.

FIG. 6 shows one example of a data processing system 800, which may be used with one embodiment. For example, the system 800 may be implemented to provide a system or device that performs any one of the methods described herein. Thus, the system 800 is an example of a simulation system, and the system 800 can execute the simulation software described herein. Note that while FIG. 6 illustrates various components of a device, it is not intended to represent any particular architecture or manner of interconnecting the components as such details are not germane to the disclosure. It will also be appreciated that network computers and other data processing systems or other consumer electronic devices, which have fewer components or perhaps more components, may also be used with embodiments of the disclosure.

As shown in FIG. 6, the device 800, which is a form of a data processing system, includes a bus 803 which is coupled to a microprocessor(s) 805 and a ROM (Read Only Memory) 807 and volatile RAM 809 and a non-volatile memory 811. The microprocessor(s) 805 may retrieve the instructions from the memories 807, 809, 811 and execute the instructions to perform operations described above. The microprocessor(s) 805 may contain one or more processing cores. The bus 803 interconnects these various components together and also interconnects these components 805, 807, 809, and 811 to a display controller and display device 813 and to peripheral devices such as input/output (110) devices 815 which may be touchscreens, mice, keyboards, modems, network interfaces, printers and other devices which are well known in the art. Typically, the input/output devices 815 are coupled to the system through input/output controllers 810. The volatile RAM (Random Access Memory) 809 is typically implemented as dynamic RAM (DRAM), which requires power continually in order to refresh or maintain the data in the memory.

The non-volatile memory 811 is typically a magnetic hard drive or a magnetic optical drive or an optical drive or a DVD RAM or a flash memory or other types of memory systems, which maintain data (e.g., large amounts of data) even after power is removed from the system. Typically, the non-volatile memory 811 will also be a random access memory although this is not required. While FIG. 6 shows that the non-volatile memory 811 is a local device coupled directly to the rest of the components in the data processing system, it will be appreciated that embodiments of the disclosure may utilize a non-volatile memory which is remote from the system, such as a network storage device which is coupled to the data processing system through a network interface such as a modem, an Ethernet interface or a wireless network. The bus 803 may include one or more buses connected to each other through various bridges, controllers and/or adapters as is well known in the art.

Portions of what was described above may be implemented with logic circuitry such as a dedicated logic circuit or with a microcontroller or other form of processing core that executes program code instructions. Thus processes taught by the discussion above may be performed with program code such as machine-executable instructions that cause a machine that executes these instructions to perform certain functions. In this context, a "machine" may be a machine that converts intermediate form (or "abstract") instructions into processor specific instructions (e.g., an abstract execution environment such as a "virtual machine" (e.g., a Java Virtual Machine), an interpreter, a Common Language Runtime, a high-level language virtual machine, etc.), and/or electronic circuitry disposed on a semiconductor chip (e.g., "logic circuitry" implemented with transistors) designed to execute instructions such as a general-purpose processor and/or a special-purpose processor. Processes taught by the discussion above may also be performed by (in the alternative to a machine or in combination with a machine) electronic circuitry designed to perform the processes (or a portion thereof) without the execution of program code.

The disclosure also relates to an apparatus for performing the operations described herein. This apparatus may be specially constructed for the required purpose, or it may comprise a general-purpose device selectively activated or reconfigured by a computer program stored in the device. Such a computer program may be stored in a non-transitory computer readable storage medium, such as, but not limited to, any type of disk including floppy disks, optical disks, CD-ROMs, and magnetic-optical disks, DRAM (volatile), flash memory, read-only memories (ROMs), RAMs, EPROMs, EEPROMs, magnetic or optical cards, or any type of media suitable for storing electronic instructions, and each coupled to a device bus.

A machine readable medium includes any mechanism for storing information in a form readable by a machine (e.g., a computer). For example, a non-transitory machine readable medium includes read only memory ("ROM"); random access memory ("RAM"); magnetic disk storage media; optical storage media; flash memory devices; etc.

An article of manufacture may be used to store program code. An article of manufacture that stores program code may be embodied as, but is not limited to, one or more non-transitory memories (e.g., one or more flash memories, random access memories (static, dynamic or other)), optical disks, CD-ROMs, DVD ROMs, EPROMs, EEPROMs, magnetic or optical cards or other type of machine-readable media suitable for storing electronic instructions. Program code may also be downloaded from a remote computer (e.g., a server) to a requesting computer (e.g., a client) by way of data signals embodied in a propagation medium (e.g., via a communication link (e.g., a network connection)) and then stored in non-transitory memory (e.g., DRAM or flash memory or both) in the client computer.

The preceding detailed descriptions are presented in terms of algorithms and symbolic representations of operations on data bits within a device memory. These algorithmic descriptions and representations are the tools used by those skilled in the data processing arts to most effectively convey the substance of their work to others skilled in the art. An algorithm is here, and generally, conceived to be a selfconsistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be kept in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "receiving," "determining," "sending," "terminating," "waiting," "changing," or the like, refer to the action and processes of a device, or similar electronic computing device, that manipulates and transforms data represented as physical (electronic) quantities within the device's registers and memories into other data similarly represented as physical quantities within the device memories or registers or other such information storage, transmission or display devices.

The processes and displays presented herein are not inherently related to any particular device or other apparatus. Various general-purpose systems may be used with programs in accordance with the teachings herein, or it may prove convenient to construct a more specialized apparatus to perform the operations described. The required structure for a variety of these systems will be evident from the description below. In addition, the disclosure is not described with reference to any particular programming language. It will be appreciated that a variety of programming languages may be used to implement the teachings of the disclosure as described herein.

In the foregoing specification, specific exemplary embodiments have been described. It will be evident that various modifications may be made to those embodiments without departing from the broader spirit and scope set forth in the following claims. The specification and drawings are, accordingly, to be regarded in an illustrative sense rather than a restrictive sense.

What is claimed is:

1. A non-transitory machine readable medium storing executable program instructions which when executed by a data processing system cause the data processing system to perform a method, the method comprising:

receiving a representation of a design of a superconductive circuit;

generating a mesh representation of at least portions of the superconductive circuit;

computing a set of one or more inductance values and a set of one or more resistance values based on the mesh representation of the superconductor circuit;

determining a set of one or more kinetic inductance values and a set of one or more superconductive resistance values;

generating a particular partial element equivalent circuit (PEEC) model of the superconductive circuit, the particular PEEC model including the determined set of one or more kinetic inductance values, the determined set of one or more superconductive resistance values, the set of one or more inductance values and the set of one or more resistance values, wherein an RLCk model of the superconductor circuit is computed from the particular PEEC model; and simulating performance of the superconductor circuit for the design of the superconductor circuit using the RLCk model.

2. The non-transitory machine readable medium as in claim 1, wherein the method further comprises: computing a set of one or more capacitance values.

3. The non-transitory machine readable medium as in claim 2, wherein the RLCk model is used to generate a netlist model.

4. The non-transitory machine readable medium as in claim 3, wherein the representation of the design comprises layout data about the superconductive circuit and geometry data based on layers of metals and dielectrics in a three dimensional stack of the superconductive circuit.

5. The non-transitory machine readable medium as in claim 3, wherein the mesh representation comprises a set of mesh cells that collectively extend over the representation of the design of the superconductive circuit, and wherein a minimum mesh cell size, used by a meshing method to generate the mesh representation, is based on a computed London penetration depth.

6. The non-transitory machine readable medium as in claim 5, wherein each mesh cell in the set of mesh cells is associated with one PEEC model from the set of PEEC models and one capacitance value from the set of capacitance values such that the set of kinetic inductance values and superconductive resistance values are computed on a per mesh cell basis.

7. The non-transitory machine readable medium as in claim 6, wherein for each mesh cell, the determined kinetic inductance value for each mesh cell and the determined superconductive resistance value for each mesh cell are connected in series and added into a PEEC model for each mesh cell in parallel across a resistance value in the PEEC model.

8. The non-transitory machine readable medium as in claim 3, wherein the method further comprises: performing numerical reduction on the netlist model to produce an output model.

9. The non-transitory machine readable medium as in claim 8, wherein superconductive resistance branches in the netlist model are combined into corresponding inductance branches.

10. The non-transitory machine readable medium as in claim 8, wherein the method further comprises: simulating a physical response of the superconductive circuit using the output model.

11. A machine implemented method, the method comprising:

receiving a representation of a design of a superconductive circuit;

generating a mesh representation of at least portions of the superconductive circuit;

computing a set of one or more inductance values and a set of one or more resistance values based on the mesh representation of the superconductor circuit;

determining a set of one or more kinetic inductance values and a set of one or more superconductive resistance values;

generating a particular partial element equivalent circuit (PEEC) model of the superconductive circuit, the particular PEEC model including the determined set of one or more kinetic inductance values, the determined set of one or more superconductive resistance values, the set of one or more inductance values and the set of one or more resistance values, wherein an RLCk model of the superconductor circuit is computed from the particular PEEC model; and simulating performance of the superconductor circuit for the design of the superconductor circuit using the RLCk model.

12. The method as in claim 11, wherein the method further comprises: computing a set of one or more capacitance values.

13. The method as in claim 12, wherein the RLCk model is used to generate a netlist model.

14. The method as in claim 13, wherein the representation of the design comprises layout data about the superconductive circuit and geometry data based on layers of metals and dielectrics in a three dimensional stack of the superconductive circuit.

15. The method as in claim 13, wherein the mesh representation comprises a set of mesh cells that collectively extend over the representation of the design of the superconductive circuit, and wherein a minimum mesh cell size, used by a meshing method to generate the mesh representation, is based on a computed London penetration depth.

16. The method as in claim 15, wherein each mesh cell in the set of mesh cells is associated with one PEEC model from the set of PEEC models and one capacitance value from the set of capacitance values such that the set of kinetic inductance values and superconductive resistance values are computed on a per mesh cell basis.

17. The method as in claim 16, wherein for each mesh cell, the determined kinetic inductance value for each mesh cell and the determined superconductive resistance value for each mesh cell are connected in series and added into a PEEC model for each mesh cell in parallel across a resistance value in the PEEC model.

18. The method as in claim 13, wherein the method further comprises: performing numerical reduction on the netlist model to produce an output model.

19. The method as in claim 18, wherein superconductive resistance branches in the netlist model are combined into corresponding inductance branches.

20. The method as in claim 18, wherein the method further comprises: simulating a physical response of the superconductive circuit using the output model.

* * * * *